United States Patent [19]

Albon

[11] Patent Number: 5,495,382
[45] Date of Patent: Feb. 27, 1996

[54] CONTENTS ADDRESSABLE MEMORY

[75] Inventor: Richard Albon, Tavistock, United Kingdom

[73] Assignee: Plessey Semiconductors Limited, United Kingdom

[21] Appl. No.: 233,857

[22] Filed: Apr. 26, 1994

[30] Foreign Application Priority Data

Apr. 28, 1993 [GB] United Kingdom ............... 9308779

[51] Int. Cl.$^6$ ............................................ G11C 15/00
[52] U.S. Cl. ............................. 365/49; 365/189.07
[58] Field of Search .................... 365/49, 201, 189.01, 365/189.07

[56] References Cited

U.S. PATENT DOCUMENTS

| | | | |
|---|---|---|---|
| 3,668,656 | 6/1972 | Hoggar | 365/49 |
| 5,258,946 | 11/1993 | Graf | 365/49 |
| 5,351,208 | 9/1994 | Jiang | 365/49 |

Primary Examiner—Terrell W. Fears
Attorney, Agent, or Firm—Kirschstein, et al.

[57] ABSTRACT

A contents addressable memory comprising an array of contents addressable memory cells arranged in rows and columns, each row of the array having a respective case between address bit values of a data word or words to be retrieved from the memory and bit values held by the cells of the respective row, and a chain of cells associated one with each match line to indicate which, if there are more than one, of the match lines indicating a match is of the highest priority.

4 Claims, 3 Drawing Sheets

CURRENT SENSE AMPLIFIER
(CSA)
WITH i TO v CONVERTER

PRIORITY CHAIN CELL (PCC)

5,495,382

CONTENTS ADDRESSABLE MEMORY

BACKGROUND OF THE INVENTION

The present invention relates to contents addressable memories. In particular although not exclusively the invention relates to contents addr as fully associative cache memories.

In the past retrieval of data stored in random access memory (RAM) has been carded out for example by algorithmic searching under the control of a microprocessor from outside the memory. Since only a small part of the RAM address space could be accessed at any one time it was necessary to sequence through all addresses until a match was found.

Contents addressable memory (CAM), on the other hand, allows the contents of a comparand register to be compared directly with all addresses held in its address space on a row by row basis. In some applications, however, it is quite likely that multiple matches will occur in a contents addressable memory, and it becomes necessary to recover a recognisable address by taking the match having the highest priority, which priority may be ascribed, for example, on the basis of position in the memory array. This is where a priority coder becomes important, and in many cases there is a need to look at a large number of match lines and potentially a large number of matches. One such scheme has utilised a tree of OR and NAND gates to select match outputs from rows which are local to each other, the resulting outputs being gated through further stages to establish a final priority match with its address. In such a scheme having, say, 512 match lines there would need to be some five stages of logic distributed across the depth of the array. Some schemes use a chain of gates in cascade with buffering and look-ahead inserted at appropriate points along the chain to minimise delays, while others adopt a parallel approach with multi-input gates. The problem with such schemes is that they are limited to small CAM structures if they are to perform quickly and not take up too much chip area.

SUMMARY OF THE INVENTION

According to the present invention in a contents addressable memory comprising an array of memory cells arranged in rows and columns and means to apply address bit values to respective columns of said memory cells for comparison with bit values held by said cells, each row having a respective match line associated therewith for indicating a match or a mis-match between said applied address bit values and the bit values held by said row, a priority encoder arrangement comprises a plurality of transmission gates associated one with each match line, said transmission gates being connected in a series path, with respective latch means to enable operation of each said transmission gate, and means to bias off in operation those transmission gates associated with match lines in respect of which a match is indicated.

Preferably said transmission gates are all initially biased on and said series path is arranged to be connected to a point of reference potential. The said latch means may be arranged to enable the operation of respective transmission gates in dependence upon the potential on said series path. There may be provided in respect of each of said transmission gates means responsive to a connection to said point of reference potential and to an indication of a match to detect the match occurring along said series path that is closest to said point of reference potential.

BRIEF DESCRIPTION OF THE DRAWINGS

A contents addressable memory (CAM) in accordance with the present invention will now be described with reference to the accompanying drawings, of which.

DETAILED DESCRIPTION OF THE PREFERRED EMBODIMENTS

Figure 1:
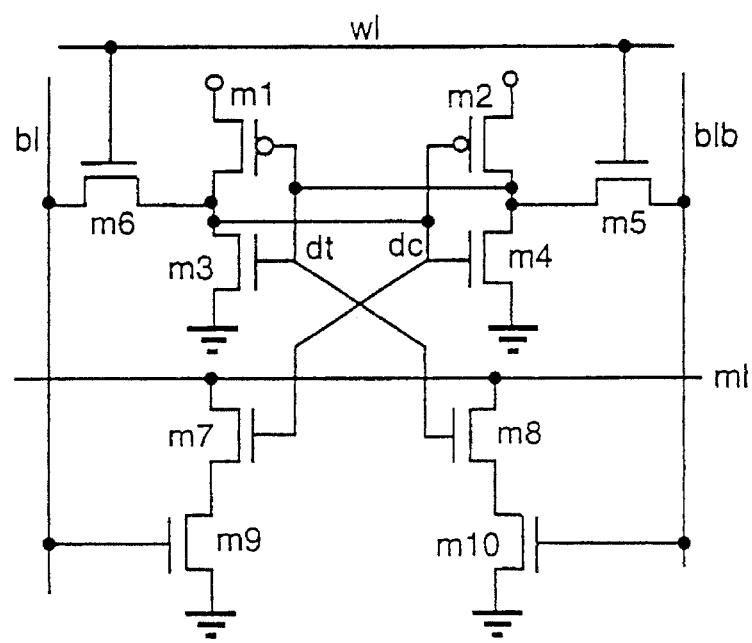
FIGS. 1 and 2 show diagrammatically two forms of contents addressable memory cell.

Referring first to FIG. 1., which shows a known form of contents addressable memory cell, bit values to be held in the cell are applied to a pair of cross-coupled inverters comprising transistors $m1$ to $m4$ from bit lines bl and blb by way of access transistors $m5$, $m6$ under the control of signals applied to a word line wl. The cells in the memory are arranged in rows and columns, and the bit values held in any row of cells represent address information in respect of data bits which are identified by that address information and which are held in a corresponding location in a random access memory (not shown).

In order to retrieve data bits held in the random access memory the necessary identifying address bit values are applied to the bit lines of respective columns of contents addressable memory cells in such a sense that at any cell where a match occurs between held bit values and address bit values the transistors of a pair $m7$, $m9$ and the transistors of a pair $m8$, $m10$ are arranged to be biased in opposite senses so that neither pair offers a conductive path between a match line ml and ground. At all cells where a mis-match occurs, however, the transistors of one or other pair $m7$, $m9$ or $m8$, $m10$ are arranged to be biased in the sense to provide a conductive path from the match line ml to ground.

The match lines ml or a row of memory cells are connected in series, and before a retrieval cycle the match lines of all rows are arranged to be charged to vdd. On any row where one or more mis-matches occur the match line is drawn down to ground potential, whereas on a row where all the held bit values match the identifying address bit values which have been applied to the bit lines, the potential of the row match line remains at vdd, indicating a match on that match line.

Figure 2:
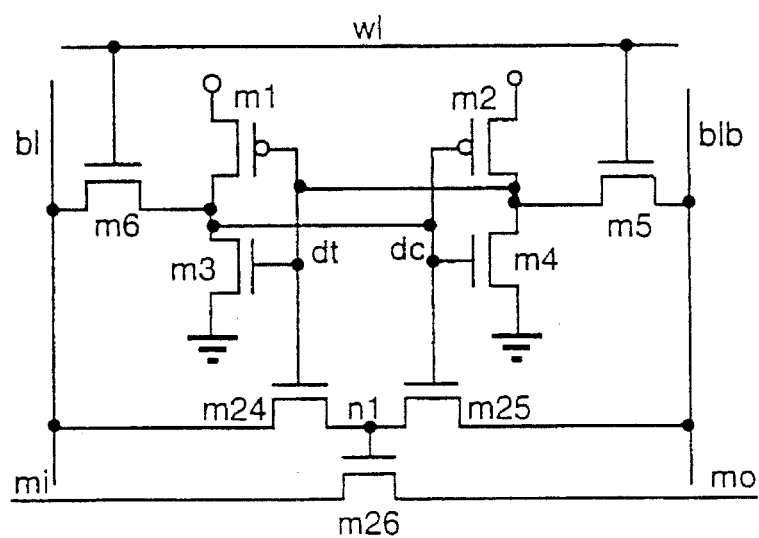

In an alternative form of memory cell shown in FIG. 2, which forms part of the subject matter of co-pending UK Patent Application No. 9308778.1, when a match occurs at any cell transistors $m24$ and $m25$ in that cell are arranged to be biased by the respective bit values to as to apply to the node n1 a forward bias for a transistor $m26$ which is connected in series in the match line between mi and mo. When a complete match occurs along a row, therefore, the match line transistors 26 of the cells in that row offer a conductive path along the row which may be sensed by means of a current sensing circuit such as that shown in FIG. 3.

Figure 3:
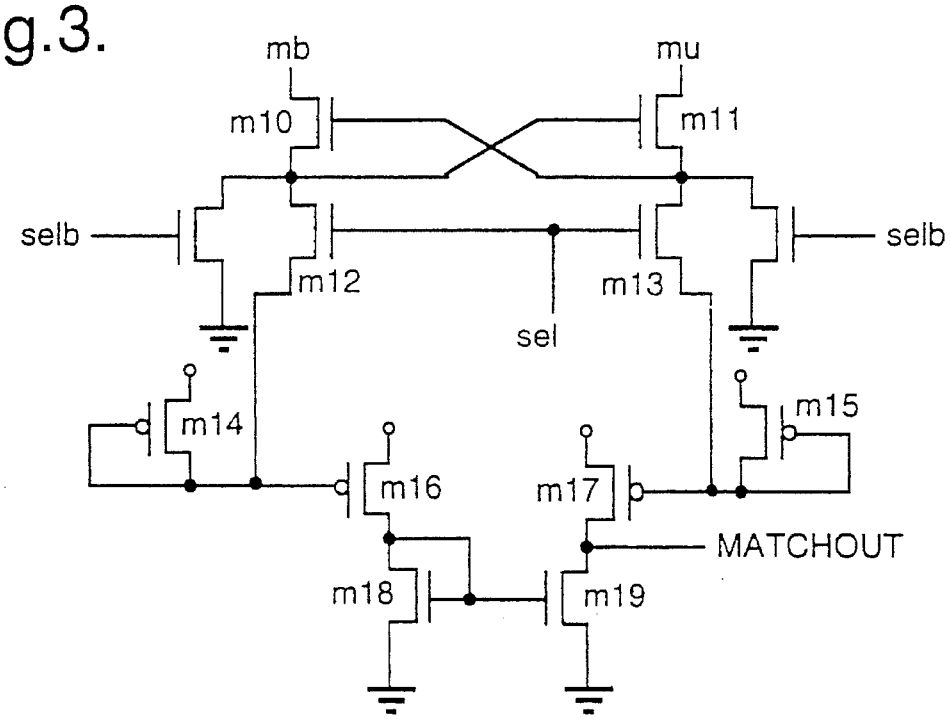
FIG. 3 shows schematically a priority chain cell for a contents addressable memory.

Referring now to the current sensing circuit shown in FIG. 3, in dependence upon the value of a current flowing in operation into a terminal mb from an associated match line ml and the value of a current flowing into a terminal mu from a dummy load (not shown), which currents are passed by a current transfer circuit m10 to m13 to respective current mirrors m14, m16 and m15, m17, a current to voltage converter comprising a single-ended current mirror m18, m19 provides a voltage output indicating which current is the larger. Thus if the associated match line is conducting, indicating a complete match along the respective row of memory cells, the value of current flowing into the terminal mb is arranged to be larger than the value of current from the dummy load, whereas in the event of a mis-match along the respective row substantially no current flows into the terminal mb.

Figure 4:
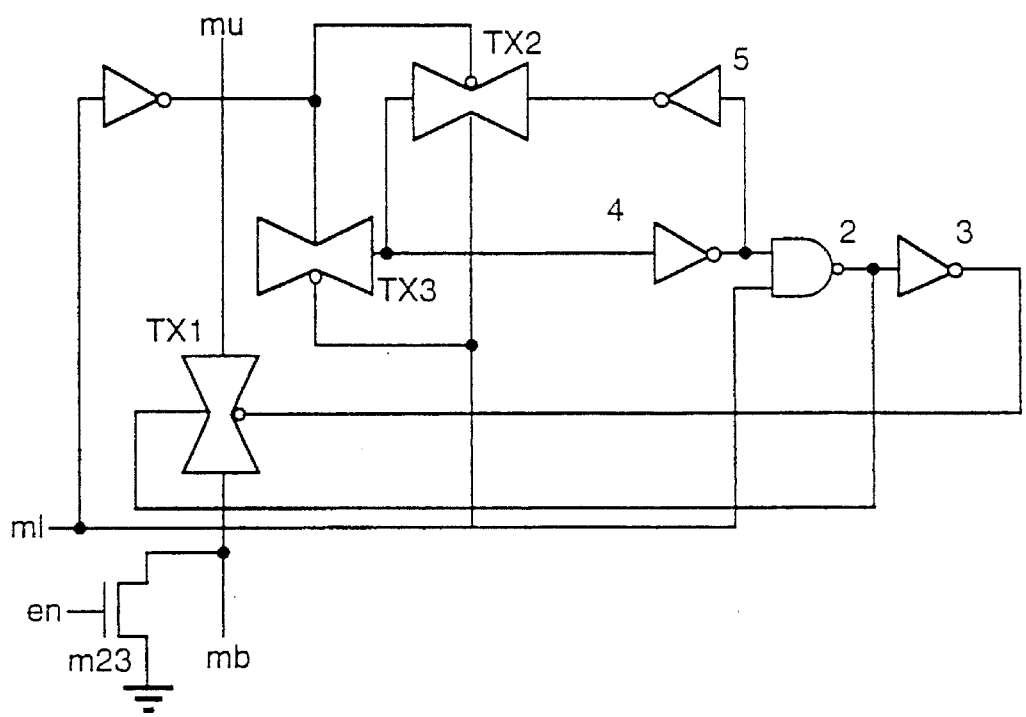
FIG. 4 shows diagrammatically a current sensing amplifier with a current to voltage converter.
Figure 5:
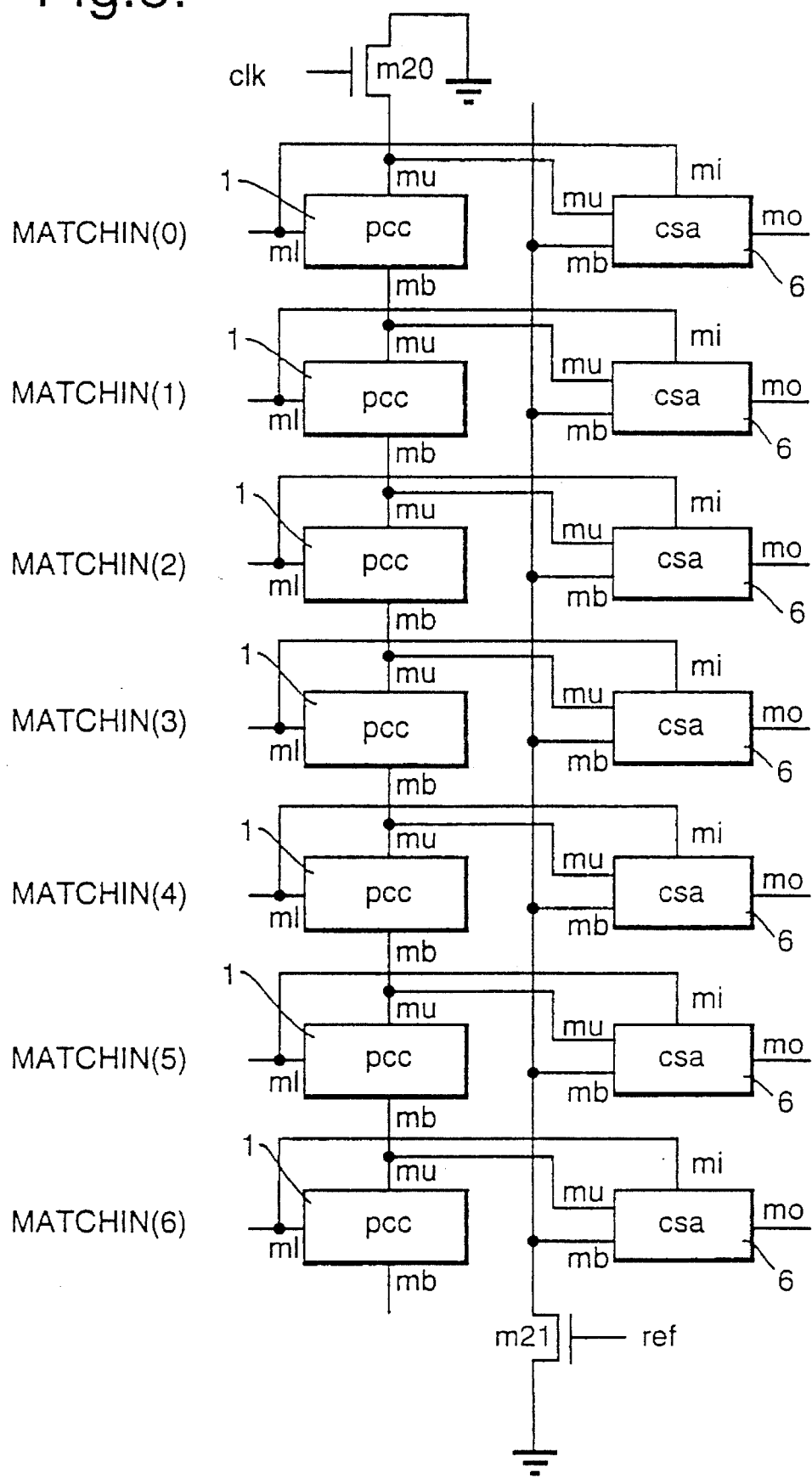
FIG. 5 shows schematically a priority chain for a contents addressable memory.

Referring now to FIGS. 4 and 5, an arrangement in accordance with the present invention for determining, in the event of a plurality of match lines indicating a match along the respective rows, which of the matches has the highest priority, comprises a chain of priority chain cells, one of which is shown schematically in FIG. 4, each connected to receive signals from a respective one of the match lines of the array of memory cells. Each priority chain cell 1 comprises a transmission gate TX1, which in its simplest form may comprise a pair of transistors (not shown) of opposite conductivity type having their major current paths connected in parallel. The conductive state of the transmission gate TX1 is arranged to be controlled by signals from the respective match line ml by way of a NAND gate 2 and an inverter 3. The NAND gate 2 has its second input connected to a latch circuit comprising inverters 4 and 5 and a second transmission gate TX2.

In operation all the nodes of the chain between the respective transmission gates TX1 are first drawn down to ground potential by way of transistors m23 (FIG. 4) which are then turned off, leaving one connection to ground by way of a transistor m20 at the top of the chain. At this time the NAND gate 2 is enabled by way of a third transmission gate TX3 and inverter 4, which applies a potential approaching vdd to the second input of the NAND gate 2.

In the subsequent comparison cycle any match lines ml on which a match is indicated are arranged to apply a potential approaching vdd to the input of the respective priority chain cell, whereupon the respective transmission gate TX1 is biased off by way of the respective NAND gate 2 and inverter 3. As indicated in FIG. 5 respective current sensing circuits 6, each of the form shown in FIG. 3, are then used to detect the interruption in the current path down the chain. It will be appreciated that only in the case of the highest prioity chain cell 1 in the chain in which the respective transmission gate TX1 is biased off will a current path to ground still be available at the terminal mu of the respective current sensing circuit 6, the current paths to ground in respect of all inputs mu connected lower in the chain being blocked by the gate or gates TX1 that have been biased off. A path to ground is offered to all the mb inputs, of approximately double the impedance of the chain of gates TX1, by way of a transistor m21. In this use of the circuit of FIG. 3 the current transfer circuits comprising transistors m10 to m13 are controlled by the signals from the respective match line circuits, only those in respect of rows in which a complete match occurs being switched so as to operate the respective current to voltage converters. The output from the circuit 6 in respect of the match highest up the chain will therefore be of the opposite sense to those of any other matches down the chain, indicating the match of highest priority, while all other circuits 6 will be disabled.

I claim:

1. A contents addressable memory, comprising: an array of memory cells arranged in rows and columns, means for applying address bit values to respective columns of said memory cells for comparison with bit values held by said cells, each row having a respective match line circuit means associated therewith for indicting a match or a mis-match between said applied address bit values and the bit values held by said row, a priority encoder means for determining which of a plurality of said match line circuit means indicating matches along the respective rows has the highest priority, said priority encoder means including a plurality of transmission gates associated one with each match line circuit means, means for connecting said transmission gates in series with one another in a series path, respective latch means for enabling operation of each said transmission gate, and means operative for biasing off those transmission gates associated with said match line circuit means in respect of which a match is indicated.

2. The contents addressable memory in accordance with claim 1, wherein said transmission gates are initially all biased on, and wherein said series path is arranged to be connected to a point of reference potential.

3. The contents addressable memory in accordance with claim 2, wherein said latch means is arranged to enable operation of the respective transmission gates in dependence upon the potential on said series path.

4. The contents addressable memory in accordance with claim 1, wherein there are provided, in respect of each of said transmission gates, means responsive to a connection to a point of reference potential and to an indication of a match for detecting the match occurring along said series path that is closest to said point of reference potential.

* * * * *